United States Patent [19]
Yamamoto

[11] Patent Number: 5,991,350
[45] Date of Patent: Nov. 23, 1999

[54] PHASE-LOCKED LOOP CIRCUIT

[75] Inventor: Koji Yamamoto, Tokyo, Japan

[73] Assignee: NEC Corporation, Tokyo, Japan

[21] Appl. No.: 08/808,685

[22] Filed: Feb. 28, 1997

[30] Foreign Application Priority Data

Feb. 29, 1996 [JP] Japan .................................. 8-042475

[51] Int. Cl.$^6$ .................................................. H03D 3/24
[52] U.S. Cl. ......................... 375/376; 375/371; 375/327
[58] Field of Search .................................... 375/371, 373,
375/327, 294, 376, 375; 370/228, 517

[56] References Cited

U.S. PATENT DOCUMENTS

| | | | |
|---|---|---|---|
| 5,446,767 | 8/1995 | Nakagawa et al. | 375/376 |
| 5,477,177 | 12/1995 | Wong et al. | 327/156 |
| 5,486,792 | 1/1996 | Girardeau, Jr. | 331/10 |
| 5,638,010 | 6/1997 | Adams | 327/105 |
| 5,701,602 | 12/1997 | Shidoma | 455/260 |
| 5,727,038 | 3/1998 | May et al. | 375/376 |

FOREIGN PATENT DOCUMENTS

| | | |
|---|---|---|
| 62-242420 | 10/1987 | Japan . |
| 63-121316 | 5/1988 | Japan . |
| 1-136417 | 5/1989 | Japan . |

*Primary Examiner*—Chi H. Pham
*Assistant Examiner*—Emmanuel Bayard
*Attorney, Agent, or Firm*—Foley & Lardner

[57] ABSTRACT

A PLL circuit includes a phase comparator, a processor and a VCO. The phase comparator compares the phase of an output signal to that of a source signal to produce M-bit phase difference data. The processor processes the M-bit phase difference data to produce N-bit phase difference data by reducing a quantization error included in the M-bit phase difference data in a synchronous and steady state based on a difference between the M-bit phase difference data and previous M-bit phase difference data which was received from the phase coarator at a previous sampling instant. The oscillator generates the output signal based on the N-bit phase difference data.

19 Claims, 3 Drawing Sheets

PHASE-LOCKED LOOP CIRCUIT

BACKGROUND OF THE INVENTION

1. Field of the Invention

The present invention generally relates to a PLL (Phase-Locked Loop) circuit and, in particular, to a PLL circuit which can be used in a digital circuit such an a clock recovery circuit of a digital communication device.

2. Description of the Related Art

There have been proposed digital PLL circuits which are designed to reduce the phase jitter and pull-in time. For example, a digital PLL circuit disclosed in Japanese Patent Unexamined Publication No. 62-242420 is provided with a frequency divider which is capable of changing the value of divisor depending on the comparison result of a phase comparator so as to suppress variations in phase.

Another digital PLL circuit disclose in Japanese Patent Unexamined Publication No. 1-136417 is provided with an up/down counter and a time-axis adjustment controller. The up/down counter increments or decrements depending on the comparison result of a phase comparator. The time-axis adjustment controller removes or inserts a pulse from or into an oscillation pulse signal depending on a count value of the up/down counter. However, when the PLL circuit is operating in a synchronous steady state, the up/down counter stops counting, which causes the time-axis adjustment controller to stop pulse phase adjustment. Stopping the pulse phase adjustment results in reduced jitter in the synchronous steady state.

Further another digital PLL circuit disclosed in Japanese Patent Unexamined Publication No. 63-121316 is provided with a loop filter comprising an 8-bit A/D converter, a processor running a tracking program and a 16-bit D/A converter. More specifically, the processor according to the tracking program controls the center frequency of a voltage controlled oscillator (VCO) so as to reduce a phase error to zero in the synchronous steady state.

SUMMARY OF THE INVENTION

A phase error signal detected by the phase comparator in the conventional digital PLL circuits inevitably includes a quantization error (or quantization noise) which causes jitter of output clock period. It is possible to reduce the quantization error by increasing the frequency of sampling clock or increasing the resolution of A/D and D/A conversion. However, as the frequency of sampling clock increases, power consumption also increases and the circuit configuration becomes complicated. As the resolution of A/D and D/A conversion increases, the cost also increases and further the circuit configuration becomes complicated.

An object of the present invention is to provide a PLL circuit which achieves further reduced jitter of output clock period in a synchronous and steady state without increasing the frequency of sampling clock.

Another object of the present invention is to provide a PLL circuit including a loop filter which is capable of reducing the quantization error of a phase error signal to achieve the stable output frequency and phase of the PLL circuit.

According to an aspect of the present invention, a PLL circuit for generating an output signal from a source signal includes a phase comparator, a processor and an oscillator. The phase comparator compares the phase of the output signal to that of the source signal to produce first discrete phase difference data. The processor processes the first discrete phase difference data to produce second discrete phase difference data by reducing a quantization error included in the first discrete phase difference data in a synchronous and steady state based on a difference between the first discrete phase difference data and previous discrete phase difference data which was received from the phase comparator at a previous sampling instant. The oscillator generates the output signal based on the second discrete phase difference data.

The processor may adjust the first discrete phase difference data according to a polarity of the difference between the first discrete phase difference data and the previous discrete phase difference data. The polarity is one of a positive polarity and a negative polarity, the positive polarity indicating that the first discrete phase difference data is greater than the previous discrete phase difference data, and the negative polarity indicating that the first discrete phase difference data is smaller than the previous discrete phase difference data.

According to another aspect of the present invention, a PLL circuit includes a phase comparator for comparing a phase of the output signal to that of the source signal to produce a phase difference signal having a pulse width corresponding to a phase difference between the output signal and the source signal. The phase difference signal is a converted into a first digital phase difference signal which is processed into a second digital phase difference signal by a processor. The bit length of the second digital phase difference signal is longer than that of the first digital phase difference signal by a predetermined number of bits. The processor reduces a quantization error included in the first digital phase difference data in a synchronous and steady state based on a difference between the first digital phase difference data and a previous digital phase difference signal which was received from the phase comparator at a previous sampling instant. The second digital phase difference signal is converted into an analog phase difference signal, based on which an oscillator generates the output signal.

DETAILED DESCRIPTION OF THE PREFERRED EMBODIMENT

Figure 1:
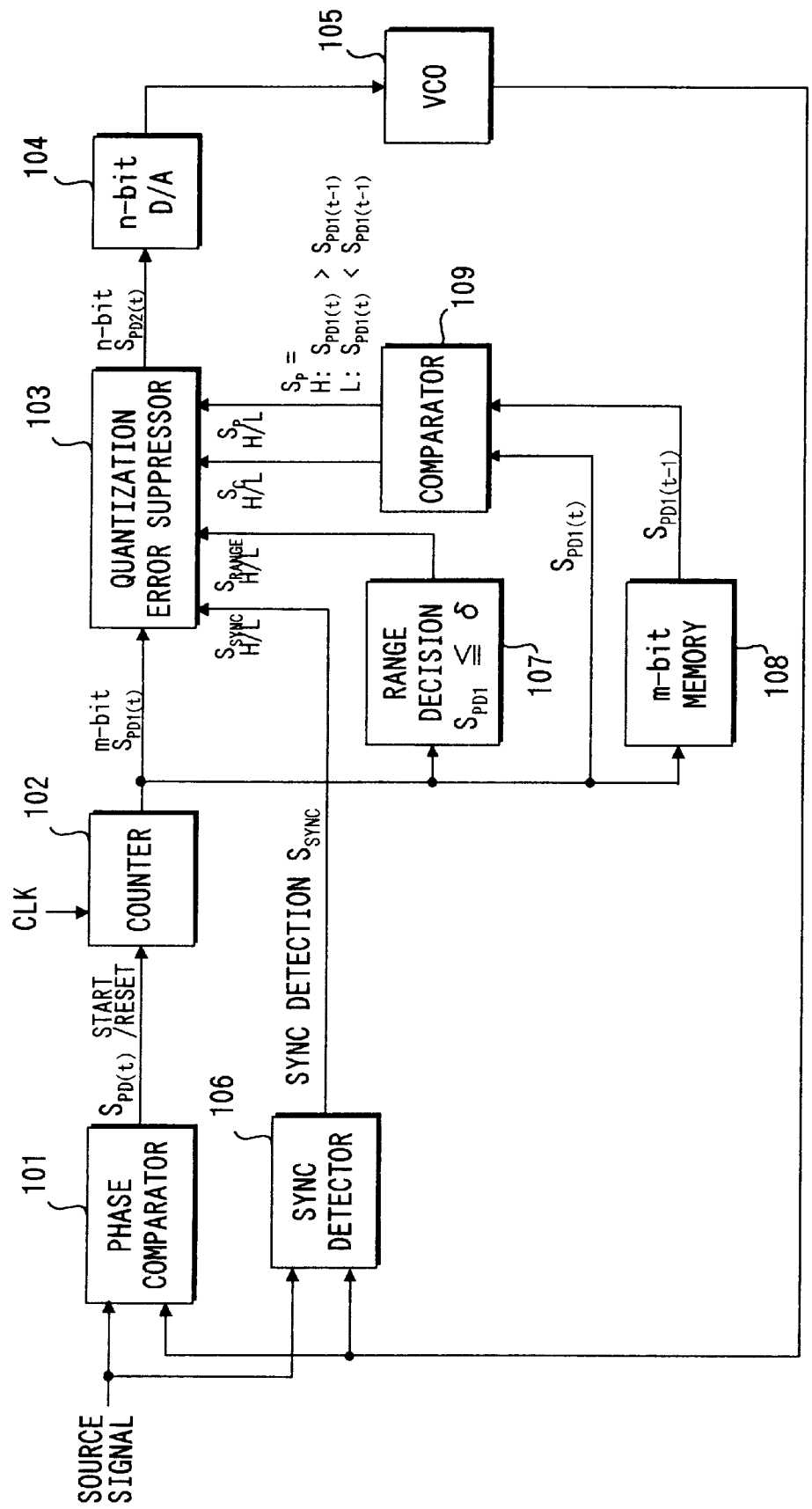
FIG. 1 is a block diagram showing a PLL circuit according to an embodiment of the present invention.

Referring to FIG. 1, there is shown a digital PLL circuit in accordance with an embodiment of the present invention. The digital PLL circuit is comprised of a loop circuit (101–105) and a control circuit (106–109). The loop circuit includes a phase comparator 101, an M-bit digital counter 102, a quantization error suppressor 103, an N-bit digital-to-analog converter 104, and a voltage controlled oscillator 105, where and N are an integer and M<N. the control circuit includes a sync detector 106, a range decision circuit 107, a N-bit memory 108, and a comparator 109.

The phase comparator 101 compares the phase of a feedback signal to that of a source signal to produce a phase error signal $S_{PD}$ whose pulse width corresponds to the difference in phase therebetween. Upon receiving the phase error signal $S_{PD}$ from the phase comparator 101, the M-bit digital counter 102 counts the number of clock pulses during the pulse width of the phase error signal $S_{PD}$ according to a clock signal CLK supplied by a clock oscillator (not shown). In other words, the M-bit digital counter 102 starts counting on the leading edge of the phase error signal $S_{PD}$ and is reset on the trailing edge. The count value of the M-bit digital counter 102 corresponding to the pulse width of the phase error signal $S_{PD}$ is output as an M-bit phase error signal $S_{PD1}(t)$ to the quantization error suppressor 103 at a sampling instant t.

The quantization error suppressor 103, as will be described later, suppresses variations of the M-bit phase error signal $S_{PD1}(t)$ in the synchronous steady state to produce an N-bit phase error signal $S_{PD2}(t)$. In the synchronous steady state, the phase error signal $S_{PD}$ is substantially kept at a constant pulse width. Actually, however, the M-bit phase error signal $S_{PD1}(t)$ of the digital counter 102 includes a quantization error caused by sampling. The magnitude of a quantization error is equivalent to the least significant bit (LSB) of the M-bit phase error signal $S_{PD1}(t)$. As described before, such a quantization error mainly causes jitter of the output clock in the synchronous steady state.

The N-bit phase error signal $S_{PD2}(t)$ which is obtained by suppressing the quantization error of the M-bit phase error signal $S_{PD1}(t)$ is converted into an analog control signal by the N-bit digital-to-analog converter 104 and the analog control signal is output to the VCO 105. The frequency of the output clock generated by the VCO 105 is controlled according to the analog control signal so as to reduce the phase error and a part of the output clock is fed back to the phase comparator 101 and the sync detector 106.

The sync detector 106, receiving the source signal and the feedback signal, detects the synchronous state by determining whether the feedback signal is synchronized with the source signal. When they are synchronized, a detection signal $S_{syn}$ of logical high (H) is output to the quantization error suppressor 103, and otherwise the detection signal $S_{SYNC}$ of logical low (L) is output.

The range decision circuit 107, receiving the M-bit phase error signal $S_{PD1}(t)$ from the digital counter 102, determines whether the M-bit phase error signal $S_{PD1}(t)$ falls into a predetermined range δ which provides the phase-locked or steady state. When the N-bit phase error signal $S_{PD1}(t)$ falls into the predetermined range δ, a detection signal $S_{RANGE}$ of logical high (H) is output to the quantization error suppressor 103, and otherwise the detection signal $S_{RANGE}$ of logical low (L) is output.

The M-bit memory 108 stores the M-bit phase error signal $S_{PD1}(t)$ received from the counter 102 during one sampling interval and then output it to the comparator 109. In other words, the M-bit memory 108 outputs an M-bit phase error signal $S_{PD1}(t-1)$ which was received at the previous sampling instant (t-1). Therefore, the comparator 109 compares the present M-bit phase error signal $S_{PD1}(t)$ to the previous N-bit phase error signal $S_{PD1}(t-1)$.

When the present M-bit phase error signal $S_{PD1}(t)$ is equal to the previous M-bit phase error signal $S_{PD1}(t-1)$, the comparator 109 outputs a comparison signal $S_C$ of logical low (L). When the prevent M-bit phase error signal $S_{PD1}(t)$ is not equal to the previous M-bit phase error signal $S_{PD1}$ (t-1), the comparator 109 outputs the comparison signal Sc of logical high (H). Further, when the present N-bit phase error signal $S_{PD1}(t)$ is greater than the previous N-bit phase error signal $S_{PD1}(t-1)$, the comparator 109 outputs a polarity signal of logical high (H). On the other hand, when the present M-bit phase error signal $S_{PD1}(t)$ is smaller than the previous M-bit phase error signal $S_{PD1}(t-1)$, the comparator 109 outputs the polarity signal of logical low (L).

QUANTIZATION ERROR SUPPRESSOR

The quantization error suppressor 103 performs bit-length conversion and quantization error suppression when the detection signal $S_{SYNC}$, the detection signal $S_{RANGE}$ and the comparison signal $S_C$ are of logical high (H), that is, the loop is in the synchronous steady state. Otherwise, the quantization error suppressor 103 performs the bit-length conversion from m-bit data to n-bit data. Detailed configuration and operation of the quantization error suppressor 103 will be described hereinafter.

Figure 2:
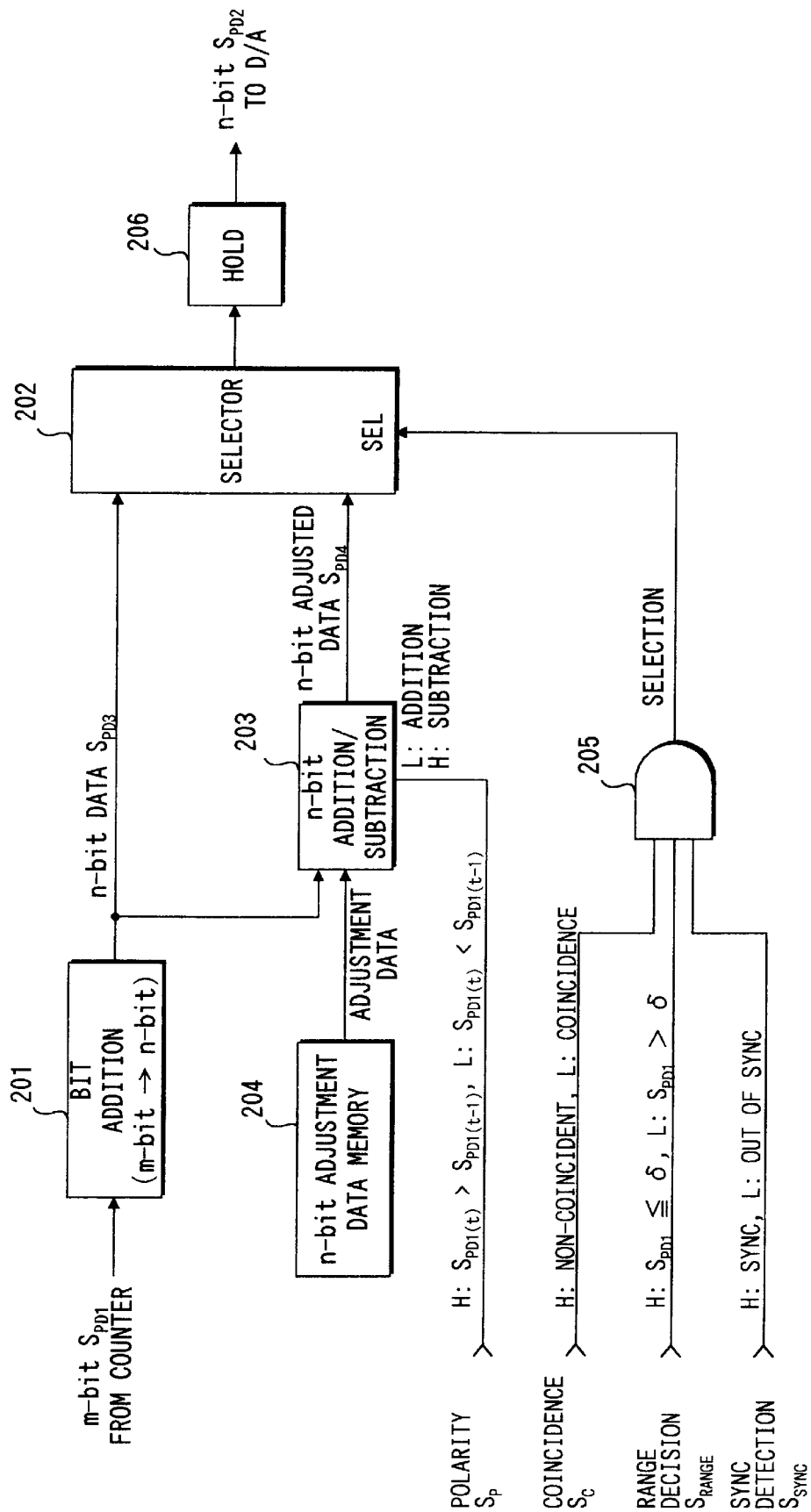
FIG. 2 is a block diagram showing a quantization error suppressor according to the embodiment.

Referring to FIG. 2, the quantization error suppressor 103 is provided with a bit-length converter 201 which converts the M-bit phase error signal $S_{PD1}$ into an N-bit data $S_{PD3}$ by adding (N—M)-bit data of "00 . . . 0" to the M-bit phase error signal $S_{PD1}$ so that the (N—M)-bit data follows the LSB of the M-bit phase error signal $S_{PD1}$. The N-bit data $S_{PD3}$ is output to a selector 202 and an N-bit adder-subtracter 203.

The N-bit adder-subtracter 203 performs addition or subtraction of the N-bit data $S_{PD1}$ and an N-bit adjustment data stored in a N-bit adjustment data memory 204 according to the polarity signal $S_P$ received from the comparator 109. The N-bit adjustment data is of "00 . . . 01" where only the LSB is one and the others zero. More specifically, the N-bit adder-subtracter 203 adds the N-bit adjustment data of "00 . . . 01" to the N-bit data $S_{PD3}$ when the polarity signal $S_P$ is of logical low (L), that is, the present M-bit phase error signal $S_{PD1}(t)$ is smaller than the previous M-bit phase error signal $S_{PD1}(t-1)$. Contrarily, the N-bit adder-subtracter 203 subtracts the N-bit adjustment data of "00 . . . 01" from the N-bit data $S_{PD3}$ when the polarity signal $S_P$ is of logical high (H), that is, the present M-bit phase error signal $S_{PD1}(t)$ is greater than the previous M-bit phase error signal $S_{PD1}(t-1)$. In this manner, the N-bit adder-subtracter 203 produces an N-bit adjusted data $S_{PD4}$ which is output to the selector 202.

The selector 202 selects one of the N-bit data $S_{PD3}$ and the N-bit adjusted data $S_{PD4}$ according to a selection signal received from a selection switch circuit comprising an AND gate 205. The AN gate 205 receives the comparison signal $S_C$ from the comparator 109, the detection signal $S_{RANGE}$ from the range decision circuit 107 and the detection signal $S_{SYNC}$ from the sync detector 106. Therefore, when all the signals $S_C$, $S_{RANGE}$ and $S_{SYNC}$ are of logical high (H), that is, the loop is in the synchronous steady and non-coincidence state, the selection signal goes high. When at least one of the signals $S_C$, $S_{RANGE}$ and $S_{SYNC}$ is of logical low (L), the selection signal goes low. When the selection signal is of logical high (H), the selector 202 selects the N-bit adjusted data $S_{PD4}$, and otherwise the N-bit data $S_{PD3}$. The selected N-bit data is output to a hold circuit (or latch) 206 which holds the selected data and outputs it as the N-bit phase error signal $S_{PD2}$ to the N-bit D/A converter 104 according to the sampling timing.

OPERATION

Figure 3:
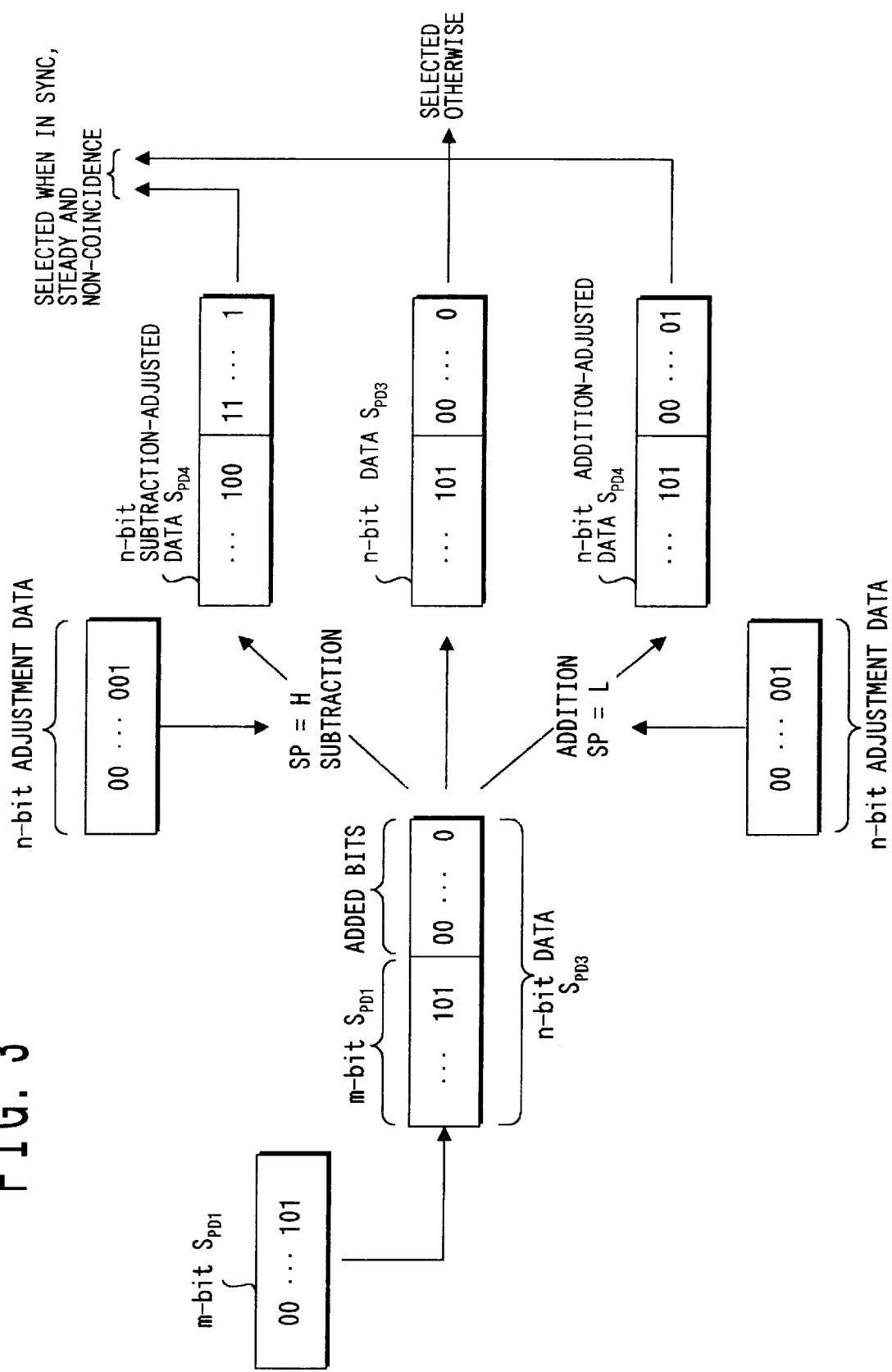
FIG. 3 is a schematic diagram showing an operation of the quantization error suppressor as shown in FIG. 2.

As shown in FIG. 3, it is assumed that the M-bit phase error signal $S_{PD1}$ is "00 . . . 101", for instance. The bit-length converter 201 adds the (N—M)-bit data of "00 . . . 0" to the M-bit phase error signal $S_{PD1}$ of "00 . . . 101" to produce the N-bit data $S_{PD3}$ of "00 . . . 10100 . . . 0". When the polarity signal $S_P$ is of logical high (H), that is, the present N-bit phase error signal $S_{PD1}(t)$ is greater than the previous N-bit phase error signal $S_{PD1}(t-1)$, the N-bit adder-subtracter 203 subtracts the N-bit adjustment data of "00 . . . 01" from the N-bit data $S_{PD3}$ of "00 . . . 10100 . . . 0" to produce an N-bit subtraction-adjusted data $S_{PD4}$ of "00 . . . 10011 . . . 1". When the polarity signal $S_P$ is of logical low (L), that is, the present M-bit phase error signal $S_{PD1}(t)$ is smaller than the previous M-bit phase error signal $S_{PD1}(t-1)$, the N-bit adder-subtracter 203 adds the N-bit adjustment data of "00 . . . 01" to the N-bit data $S_{PD3}$ of "00 . . . 10100 . . . 0" to produce an N-bit addition-adjusted data $S_{PD4}$ of "00 . . . 10100 . . . 01". In this case, since the present M-bit phase error signal $S_{PD1}(t)$ is not coincident to the previous M-bit phase error signal $S_{PD1}(t-1)$, the comparison signal $S_C$ is of logical high (H). Therefore, in the case of the synchronous steady state and non-coincidence state, the selector 202 selects the N-bit adjusted data $S_{PD4}$ which is output to the N-bit D/A converter 104.

On the other hand, when at least one of the signals $S_C$, $S_{RANGE}$ and $S_{SYNC}$ is of logical low (L), the N-bit data $S_{PD3}$ of "00 . . . 10100 . . . 0" is selected and output to the N-bit D/A converter 104. In other words, in the case of either one or more of out-of-sync, out-of-range and coincidence state, the AND gate 205 outputs the selection signal of a logical low which causes the selector to select the N-bit data $S_{PD3}$ of the bit-length converter 201.

An described above, the comparator 109 compares the present phase error signal $S_{PD1}(t)$ to the previous phase error signal $S_{PD1}(t-1)$ and, depending on the comparison result of the comparator 109, the predetermined adjustment data is added or subtracted to or from the bit-added data $S_{PD3}$. Such an adjusted data $S_{PD4}$ is selected to be output to the D/A converter 104 when the loop is operating in snychronous steady state and the comparison result is non-coincidence. Since the analog control signal supplied to the VCO 105 is obtained based on the adjusted data $S_{PD4}$, the quantization error caused by sampling is reduced without increasing the frequency of the counter clock CLK. This results in suppressed jitter of the output clock.

In the above embodiment, the quantization error suppressor 103, the range decision circuit 107, the M-bit memory 108 and the comparator 109 may be implemented with software running on a processor.

What is claimed is:

1. A phase-locked loop circuit for generating an output signal from a source signal, comprising:

a phase comparator for comparing a phase of the output signal to that of the source signal to produce first digital phase difference data in sampling intervals;

a processor coupled to said phase comparator for receiving said first digital phase difference data and processing the first digital phase difference data to produce second digital phase difference data whose bit length is longer than that of the first digital phase difference data by a predetermined number of bits, the processor reducing a quantization error included in the first digital phase difference data in a synchronous and steady state based on a difference between the first digital phase difference data and previous digital phase difference data which was received from the phase comparator at a previous sampling instant; and an oscillator coupled to said processor for receiving said second digital phase difference data for generating the output signal based on the second digital phase difference data.

2. The phase-locked loop circuit according to claim 1, wherein the processor adjusts the first digital phase difference data according to a polarity of the difference between the first digital phase difference data and the previous first digital phase difference data, the polarity being one of a positive polarity and a negative polarity, the positive polarity indicating that the first digital phase difference data is greater than the previous first digital phase difference data, and the negative polarity indicating that the first digital phase difference data is smaller than the previous first digital phase difference data.

3. The phase-locked loop circuit according to claim 2, wherein the processor decreases the first digital phase difference data by a predetermined value when the polarity of the difference is positive and increases the first digital phase difference data by the predetermined value when the polarity of the difference is negative.

4. The phase-locked loop circuit according to claim 1, wherein the processor comprises:

a delay memory for storing the previous first digital phase difference data at the previous sampling instant;

a comparator for comparing the first digital phase difference data to the previous first digital phase difference data to produce a comparison result; and a quantization error suppressor for adjusting the first digital phase difference data according to the comparison result to produce the second digital phase difference data.

5. The phase-locked loop circuit according to claim 4, wherein the quantization error suppressor adjusts the fist digital phase difference data according to a polarity of the comparison result which is one of a positive polarity and a negative polarity, the positive polarity indicating that the first digital phase difference data is greater than the previous first digital phase difference data, and the negative polarity indicating that the first digital phase difference data is smaller than the previous first digital phase difference data.

6. The phase-locked loop circuit according to claim 5, wherein the quantization error suppressor decreases the first digital phase difference data by a predetermined value when the polarity of the comparison result is positive and increases the first digital phase difference data by the predetermined value when the polarity of the comparison result is negative.

7. The phase-locked loop circuit according to claim 5, wherein the quantization error suppressor comprises:

a selectable adder-subtracter, for subtracting a predetermined value from the first digital phase difference data when the polarity of the comparison result is positive and for adding the predetermined value to the first digital phase difference data when the polarity of the comparison result is negative, the selectable adder-subtracter producing adjusted digital phase difference data; and a selector for selecting the adjusted digital phase difference data when the comparison result is one of the positive polarity and the negative polarity and selecting the first digital phase difference data when the comparison result indicates that the first digital phase difference data is coincident to the previous first digital phase difference data.

8. A phase-locked loop circuit for generating an output signal from a source signal, comprising:

a phase comparator for comparing a phase of the output signal to that of the source signal to produce a phase difference signal having a pulse width corresponding to a phase difference between the output signal and the source signal;

a first converter coupled to said phase comparator and converting the phase difference signal into a first digital phase difference signal in sampling intervals;

a processor coupled to said first converter for receiving said first digital phase difference signal and processing the first digital phase difference signal to produce a second digital phase difference signal whose bit length is longer than that of the first digital phase difference signal by a predetermined number of bits, the processor reducing a quantization error included in the first digital phase difference data in a synchronous and steady state based on a difference between the first digital phase difference data and a previous digital phase difference signal which was received from the phase comparator at a previous sampling instant;

a second converter coupled to said processor and converting the second digital phase difference signal into an analog phase difference signal; and an oscillator coupled to said second converter and generating the output signal based on the analog phase difference signal.

9. The phase-locked loop circuit according to claim 8, wherein the processor adjusts the first digital phase difference signal according to a polarity of the difference between the first digital phase difference signal and the previous digital phase difference signal, the polarity being one of a positive polarity and a negative polarity, the positive polarity indicating that the first digital phase difference signal is greater than the previous digital phase difference signal, and the negative polarity indicating that the first digital phase difference signal is smaller than the previous digital phase difference signal.

10. The phase-locked loop circuit according to claim 9, wherein the processor decreases the first digital phase difference signal by a predetermined value when the polarity of the difference is positive and increases the first digital phase difference signal by the predetermined value when the polarity of the difference is negative.

11. The phase-locked loop circuit according to claim 8, wherein the processor comprises:

a delay memory for storing the previous digital phase difference signal at the previous sampling instant;

a comparator for comparing the first digital phase difference signal to the previous digital phase difference signal to produce a comparison result; and a quantization error suppressor for adjusting the first digital phase difference signal according to the comparison result to produce the second digital phase difference signal.

12. The phase-locked loop circuit according to claim 11, wherein the quantization error suppressor adjusts the first digital phase difference signal according to a polarity of the comparison result which is one of a positive polarity and a negative polarity, the positive polarity indicating that the first digital phase difference signal is greater than the previous digital phase difference signal, and the negative polarity indicating that the first digital phase difference signal is smaller than the previous digital phase difference signal.

13. The phase-locked loop circuit according to claim 12, wherein the quantization error suppressor comprises:

a bit-length converter for converting the first digital phase difference signal of M-bit into an N-bit digital phase difference signal (N>M: M and N are an integer) by adding the predetermined number (N—M) of bits to a first digital phase difference signal so that the least significant bit (LSB) of the first digital phase difference signal is followed by the predetermined number (N—M) of bits;

a selectable adder-subtracter, for subtracting the predetermined value from the N-bit digital phase difference signal when the polarity of the comparison result is positive and for adding the predetermined value to the N-bit digital phase difference signal when the polarity of the comparison result in negative, the selectable adder-subtracter producing adjusted N-bit digital phase difference signal; and a selector for selecting the adjusted N-bit digital phase difference signal when the comparison result is one of the positive polarity and the negative polarity and selecting the bit digital phase difference signal when the comparison result indicates that the first digital phase difference signal is coincident to the previous digital phase difference signal, the selector producing a selected N-bit digital phase difference signal as the second digital phase difference signal.

14. The phase-locked loop circuit according to claim 8, wherein the first converter comprises:

a clock generator for generating a clock pulse signal of a predetermined frequency; and a digital counter for counting the number of pulses of the clock pulse signal during the pulse width of the phase difference signal to produce the first digital phase difference signal.

15. The phase-locked loop circuit according to claim 8, further comprising:

a synchronization detector for detecting a synchronization state of the phase-locked loop circuit by using the source signal and the output signal; and a range detector for detecting a steady state of the phase-locked loop circuit by deciding whether the first digital phase difference signal falls into a predetermined range.

16. A method for generating an output signal from a source signal, comprising the steps of:

a) comparing a phase of the output signal to that of the source signal to produce first digital phase difference data in sampling intervals;

b) processing the first digital phase difference data to produce second digital phase difference data having a bit length longer than that of the first digital phase difference signal by a predetermined number of bits so that a quantization error included in the first digital phase difference data is suppressed in a synchronous and steady state based on a difference between the first digital phase difference data and previous first digital phase difference data which was received at a previous sampling instant; and c) generating the output signal based on the second digital phase difference data.

17. The method according to claim 16, wherein the step (b) comprises the steps of:

decreasing the first digital phase difference data by a predetermined value when the first digital phase difference data is greater than the previous first digital phase difference data; and increasing the first discrete phase difference data by the predetermined value when the first digital phase difference data is smaller than the previous first digital phase difference data.

18. The method according to claim 16, wherein the step (b) comprises the steps of:

processing the first digital phase difference data to produce an adjusted digital phase difference data by subtracting a predetermined value from the first digital phase difference data when the first digital phase difference data is greater than the previous first digital phase difference data and by adding the predetermined value to the first digital phase difference data when the first digital phase difference data is smaller than the previous first digital phase difference data;

selecting the adjusted digital phase difference data when the first digital phase difference data is not coincident to the previous first digital phase difference data; and selecting the first digital phase difference data when the first digital phase difference data is coincident to the previous first digital phase difference data.

19. The phase-locked loop circuit according to claim 8, wherein the processor comprises a digital loop filter.

* * * * *